United States Patent
Kim et al.

(10) Patent No.: US 8,803,133 B2
(45) Date of Patent: Aug. 12, 2014

(54) ORGANIC LIGHT EMITTING DIODE DEVICE

(75) Inventors: Yong-Tak Kim, Yongin (KR); Won-Jong Kim, Yongin (KR); Ji-Young Choung, Yongin (KR); Joon-Gu Lee, Yongin (KR); Jin-Baek Choi, Yongin (KR); Kyu-Hwan Hwang, Yongin (KR); Il-Soo Oh, Yongin (KR); Jong-Hyuk Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 12/969,747

(22) Filed: Dec. 16, 2010

(65) Prior Publication Data

US 2012/0007055 A1 Jan. 12, 2012

(30) Foreign Application Priority Data

Jul. 6, 2010 (KR) .................... 10-2010-0064919

(51) Int. Cl.
*H01L 51/52* (2006.01)

(52) U.S. Cl.
USPC .................................................. 257/40

(58) Field of Classification Search
CPC ......... H01L 51/52; H01L 51/50; H01L 51/54; H01L 51/5234; H05B 33/26; H05B 33/28
USPC ............ 257/40, 89, E51.018, E51.019, 257/E51.022; 313/113, 498, 503, 504, 506; 445/24; 427/66; 428/427, 457, 690, 428/917
See application file for complete search history.

(56) References Cited

U.S. PATENT DOCUMENTS

| | | | |
|---|---|---|---|
| 6,734,622 B1 | 5/2004 | Kanitz et al. | |
| 7,414,362 B2 | 8/2008 | Chung et al. | |
| 2004/0075382 A1* | 4/2004 | Stegamat et al. | 313/506 |
| 2006/0263628 A1* | 11/2006 | Aziz et al. | 428/690 |
| 2008/0157663 A1 | 7/2008 | Sung et al. | |
| 2008/0241561 A1* | 10/2008 | Jeong et al. | 428/472 |
| 2010/0167440 A1* | 7/2010 | Roberts | 438/27 |

FOREIGN PATENT DOCUMENTS

JP 2008166283 A 7/2008

(Continued)

OTHER PUBLICATIONS

Authors: Shih-Feng Hsu, Shiao-Wen Hwang, and Chin H. Chen Title: "4.2: Highly Efficient Top-Emitting White Organic Electroluminescent Devices" SID Symposium Digest 36, 32 (2005).*

G. Ran, G. Ma, Y. Xu, L. Dai, and G. Qin, "Light extraction efficiency of a top-emission organic light-emitting diode with an Yb/Au double-layer cathode and an opaque Si anode," Appl. Opt. 45, 5871-5876 (2006).*

(Continued)

Primary Examiner — Walter H Swanson
(74) Attorney, Agent, or Firm — Robert E. Bushnell, Esq.

(57) ABSTRACT

An organic light emitting diode device includes a first electrode, a second electrode, and an emission layer disposed between the first and second electrodes. The first electrode includes a first layer and a second layer. The first layer includes ytterbium (Yb), samarium (Sm), lanthanum (La), yttrium (Y), calcium (Ca), strontium (Sr), cesium (Cs), ruthenium (Ru), barium (Ba), or a combination thereof and having a thickness ranging from about 40 to 200 Å. The second layer includes silver (Ag), aluminum (Al), copper (Cu), chromium (Cr), or a combination thereof and having a thickness ranging from about 100 to 250 Å.

6 Claims, 4 Drawing Sheets

(56) References Cited

FOREIGN PATENT DOCUMENTS

| | | |
|---|---|---|
| JP | 2010102966 A | 5/2010 |
| KR | 10-2001-0109321 | 12/2001 |
| KR | 10-2006-0002399 | 1/2006 |
| KR | 10-2006-0053692 | 5/2006 |
| KR | 10-2007-0043293 | 4/2007 |
| KR | 10-2008-0061732 | 7/2008 |

OTHER PUBLICATIONS

Shih-Feng Hsu, Chung-Chun Lee, Shiao-Wen Hwang, and Chin H. Chen, "Highly efficient top-emitting white organic electroluminescent devices," Appl. Phys. Lett. 86, 253508 (2005).*

Ma, G.L., et al. "Novel transparent Yb-based cathodes for top-emitting organic light emitting devices with high performance." *Applied Surface Science*. No. 252. 2006. pp. 3580-3584.

* cited by examiner

ORGANIC LIGHT EMITTING DIODE DEVICE

CROSS-REFERENCE TO RELATED APPLICATION

This application claims priority to and the benefit of Korean Patent Application No. 10-2010-0064919, filed in the Korean Intellectual Property Office on Jul. 6, 2010, the entire disclosure of which is incorporated herein by reference.

BACKGROUND

1. Field

This disclosure relates to an organic light emitting diode device.

2. Description of the Related Art

Recently, there has been a desire to make a monitor, a television, or the like smaller and lighter. Accordingly, a cathode ray tube (CRT) has been replaced with a liquid crystal display (LCD). However, the liquid crystal display (LCD) needs a separate backlight as it is a non-emissive element, but also has a limit in a response speed, a viewing angle, and the like.

Recently, these limits have been overcome by an organic light emitting diode device (OLED device). The organic light emitting diode device may include two electrodes and an emission layer disposed between the two electrodes. When electrons are injected from one electrode and combine with holes injected from the other electrode in the emission layer, they form an exciton. When the exciton releases energy, the organic light emitting diode device emits light.

However, the light emitted from the emission layer passes through at least one of the two electrodes and is externally emitted. Herein, the light emitted from the emission layer may be lost by the electrode.

When an electrode has a high transmittance, it may lose less light emitted from the emission layer. However, an electrode having high transmittance generally has a high resistance and has a limit in being applied to an organic light emitting diode device having a large area.

SUMMARY

An aspect of the present invention provides an organic light emitting diode device including an electrode having high transmittance but low resistance.

An embodiment of the present invention provides an organic light emitting diode device including a first electrode, a second electrode facing with the first electrode, and a light emitting member disposed between the first and second electrodes. The first electrode may include a first layer including ytterbium (Yb), samarium (Sm), lanthanum (La), yttrium (Y), calcium (Ca), strontium (Sr), cesium (Cs), ruthenium (Ru), barium (Ba), or a combination thereof and having a thickness ranging from about 40 to 200 Å and a second layer including silver (Ag), aluminum (Al), copper (Cu), chromium (Cr), or a combination thereof and having a thickness ranging from about 100 to 250 Å.

According to an aspect of the invention, the first electrode may have a transmittance ranging from about 20 to 50% in a wavelength of about 550 nm.

According to an aspect of the invention, the first electrode may have a sheet resistance of about 10 $\Omega/cm^2$ or lower.

According to an aspect of the invention, the first electrode may have a sheet resistance of about 5 $\Omega/cm^2$ or lower.

According to an aspect of the invention, the first layer may include ytterbium (Yb), while the second layer may include silver (Ag).

According to an aspect of the invention, the first electrode may further include a third layer including an oxide, a nitride, or a nitrogen oxide.

According to an aspect of the invention, the third layer may have a refractive index of about 1.5 or higher.

According to an aspect of the invention, the first electrode may be a cathode, and the second electrode may be an anode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
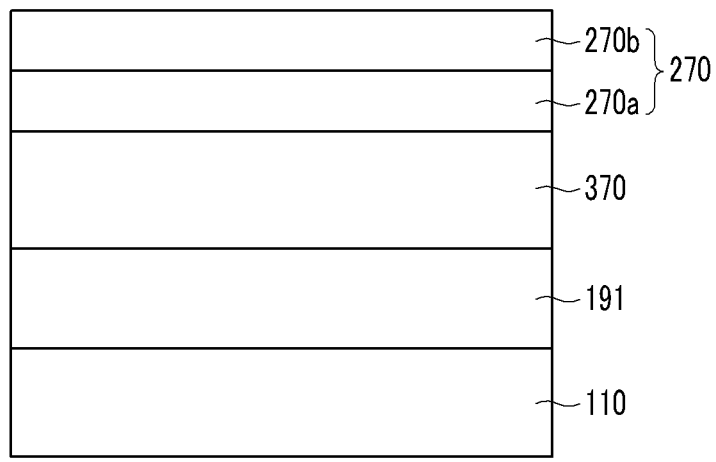
FIG. 1 is a cross-sectional view showing an organic light emitting diode device according to one embodiment.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Referring to FIG. 1, an organic light emitting diode device will be described in accordance with an embodiment of this disclosure. FIG. 1 is a cross-sectional view showing the organic light emitting diode device according to one embodiment.

The organic light emitting diode device includes a substrate 110, a lower electrode 191 on the substrate 110, a light emitting member 370 on the lower electrode 191, and an upper electrode 270 on the light emitting member 370. While not required, additional layers (such as buffer and planarization layers can be included between adjacent pairs of the shown layers 270, 370, 191, 110. For purposes of simplicity, the driving portions and wiring elements are not shown. However, it is understood that the organic light emitting diode device can be included in a larger display comprising pixels.

The substrate 110 may be made of glass, a silicon wafer, a polymer film, and the like. The lower electrode 191 may be made of a transparent conductor or an opaque conductor. The transparent conductor may be, for example, a transparent conductive oxide. The opaque conductor may be, for example, a metal such as aluminum (Al), copper (Cu), molybdenum (Mo), silver (Ag), or a combination thereof.

The light emitting member 370 may have a multi-layer structure including an emission layer and an auxiliary layer to improve efficiency of the emission layer. The emission layer may be made of an organic material emitting one light among primary colors (such as red, green, blue, and the like), or a mixture. It is understood that the emission layer is not limited to primary colors, and can be any color (such as yellow) which is to be emitted in addition to or instead of one of the primary colors.

The mixture can be of an inorganic material with the organic material, for example, a polyfluorene derivative, a (poly)paraphenylenevinylene derivative, a polyphenylene derivative, a polyfluorene derivative, polyvinylcarbazole, a polythiophene derivative, or a compound prepared by doping these polymer materials with a perylene-based pigment, a cumarine-based pigment, a rothermine-based a pigment, rubrene, perylene, 9,10-diphenylanthracene, tetraphenylbutadiene, Nile red, coumarin, quinacridone, and the like. The organic light emitting diode device may display an image through a spatial sum of basic colors emitted from an emission layer.

The auxiliary layer may include an electron transport layer (ETL) and a hole transport layer (HTL) for balancing between electrons and holes, and an electron injection layer (EIL) and a hole injection layer (HIL) for reinforcing injection of electrons and holes, and the like. It may include one or more layers selected therefrom.

The shown upper electrode 270 includes a first layer 270a and a second layer 270b. The first layer 270a may include ytterbium (Yb), samarium (Sm), lanthanum (La), yttrium (Y), calcium (Ca), strontium (Sr), cesium (Cs), ruthenium (Ru), barium (Ba), or a combination thereof. The metals have a low work function, which may allow easy injection of electrons, and have high transmittance in a visible ray region.

The second layer 270b may include silver (Ag), aluminum (Al), copper (Cu), chromium (Cr), or a combination thereof. These metals have low resistance and thus may decrease resistance of the upper electrode 270.

While not required in all aspects, the first layer 270a has a thickness ranging from about 40 to 200 Å, while the second layer 270b has a thickness ranging from about 100 to 250 Å. When the first and second layers 270a and 270b have a thickness within the range, they may improve transmittance but prevent a sharp resistance increase.

The first layer 270a has a high transmittance but also a high resistance. The metals forming the second layer 270b have a low resistance and various transmittances depending on the thickness. Accordingly, the first and second layers 270a and 270b respectively have a thickness ranging from about 40 to 200 Å and about 100 to 250 Å, and thus may simultaneously satisfy transmittance and resistance required for a transparent electrode. Specifically, since the first and second layers 270a and 270b have a thickness within the above range, they may secure transmittance ranging from about 20 to 50% in a wavelength of about 550 nm, and simultaneously have sheet resistance of about 10 $\Omega/cm^2$ or lower.

Figure 4:
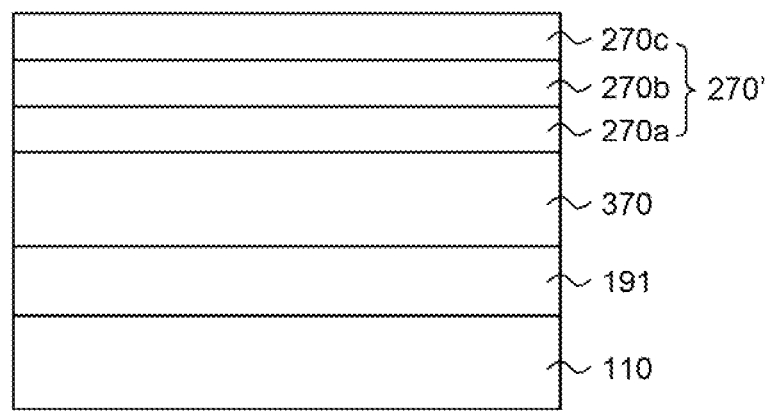
FIG. 4 is a cross-sectional view showing an organic light emitting, diode device according to another embodiment.

FIG. 4 is a cross-sectional view showing an organic light emitting diode device according to another embodiment. The organic light emitting diode device according to this embodiment includes a substrate 110, a lower electrode 191 on the substrate 110, a light emitting member 370 on the lower electrode 191, and an upper electrode 270' on the light emitting member 370. The upper electrode 270' includes a first layer 270a and a second layer 270b. The upper electrode 270' may further include a third layer 270c on the second layer 270b such that the second layer 270b is between the third layer 270c and the first layer 270a. The third layer 270c may be formed of an oxide, a nitride, or a nitrogen oxide (for example silicon oxide, silicon nitride, silicon oxynitride, or a combination thereof). The third layer 270c has a high refractive index of about 1.5 or higher. The high refractive index layer may increase phototransmittance, and thus increase efficiency.

The following examples illustrate aspects of the present invention in more detail. These examples, however, are not in any sense to be interpreted as limiting the scope of this disclosure.

Fabrication of an Organic Light Emitting Diode Device

Example 1

ITO was disposed on a glass substrate and patterned. Next, Alq3 as an electron transport layer was deposited thereon. Then, co-deposition was performed by doping 1 wt % of coumarin 6 in Alq3 (tris_8-hydroxyquinoline_aluminum) to provide an emission layer. Then, N,N-dinaphthalen-1-yl-N, N-diphenyl-benzidine (NPB) was deposited thereon as a hole injection layer (HIL) and a hole transport layer. Subsequently, ytterbium (Yb) was deposited at a thickness of 80 Å, and silver (Ag) was deposited at a thickness of 180 Å.

Example 2

An organic light emitting diode device was fabricated according to the same method as in Example 1, except for depositing ytterbium (Yb) at a thickness of 80 Å and then silver (Ag) at a thickness of 220 Å thereon.

Example 3

An organic light emitting diode device was fabricated according to the same method as in Example 1, except for depositing ytterbium (Yb) at a thickness of 60 Å and then silver (Ag) at a thickness of 200 Å thereon.

Example 4

An organic light emitting diode device was fabricated according to the same method as in Example 1, except for depositing ytterbium (Yb) at a thickness of 60 Å and then silver (Ag) at a thickness of 220 Å thereon.

Example 5

An organic light emitting diode device was fabricated according to the same method as in Example 1, except for depositing ytterbium (Yb) at a thickness of 40 Å and then silver (Ag) at a thickness of 180 Å thereon.

Example 6

An organic light emitting diode device was fabricated according to the same method as in Example 1, except for depositing ytterbium (Yb) at a thickness of 40 Å and then silver (Ag) at a thickness of 220 Å thereon.

Example 7

An organic light emitting diode device was fabricated according to the same method as in Example 1, except for depositing ytterbium (Yb) at a thickness of 120 Å and then silver (Ag) at a thickness of 100 Å thereon.

Example 8

An organic light emitting diode device was fabricated according to the same method as in Example 1, except for depositing ytterbium (Yb) at a thickness of 120 Å and then silver (Ag) at a thickness of 150 Å thereon.

Example 9

An organic light emitting diode device was fabricated according to the same method as in Example 1, except for depositing ytterbium (Yb) at a thickness of 180 Å and then silver (Ag) at a thickness of 140 Å thereon.

Example 10

An organic light emitting diode device was fabricated according to the same method as in Example 1, except for depositing ytterbium (Yb) at a thickness of 200 Å and then silver (Ag) at a thickness of 120 Å thereon.

Comparative Example 1

An organic light emitting diode device was fabricated according to the same method as in Example 1, except for depositing ytterbium (Yb) at a thickness of 35 Å and then silver (Ag) at a thickness of 250 Å thereon.

Comparative Example 2

An organic light emitting diode device was fabricated according to the same method as in Example 1, except for depositing ytterbium (Yb) at a thickness of 30 Å and then silver (Ag) at a thickness of 260 Å thereon.

Comparative Example 3

An organic light emitting diode device was fabricated according to the same method as in Example 1, except for depositing ytterbium (Yb) at a thickness of 180 Å and then silver (Ag) at a thickness of 80 Å thereon.

Comparative Example 4

An organic light emitting diode device was fabricated according to the same method as in Example 1, except for depositing ytterbium (Yb) at a thickness of 220 Å and then silver (Ag) at a thickness of 120 Å thereon.

Comparative Example 5

An organic light emitting diode device was fabricated according to the same method as in Example 1, except for depositing magnesium-aluminum (MgAl) at a thickness of 300 Å as a single layer.

Evaluation

The organic light emitting diode devices according to Examples 1 to 10 were evaluated regarding resistance, transmittance, and reflectance characteristics. Herein, the resistance was measured through sheet resistance. The sheet resistance was measured using a 4 point probe method.

Figure 2:
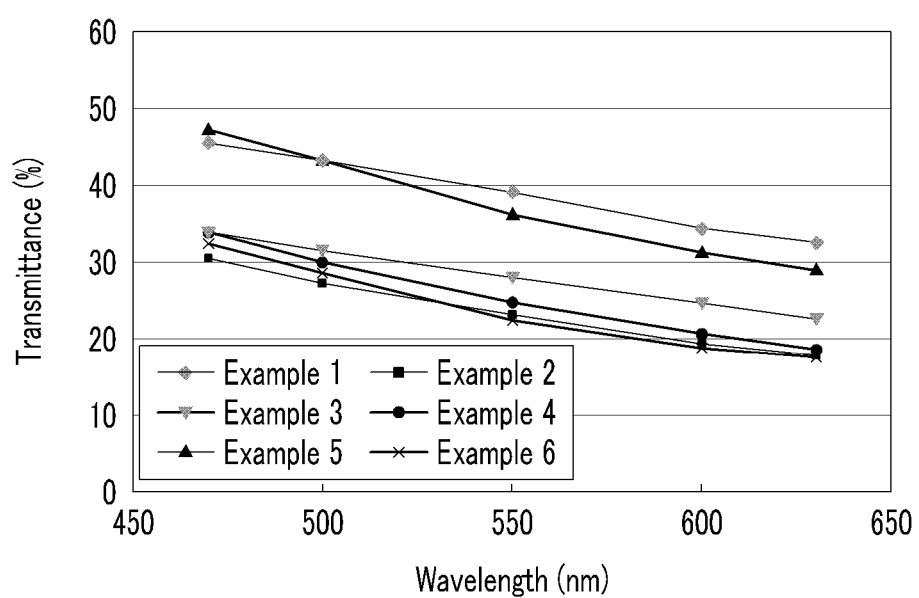
FIG. 2 is a graph showing transmittance of the organic light emitting diode devices according to Examples 1 to 6.
Figure 3:
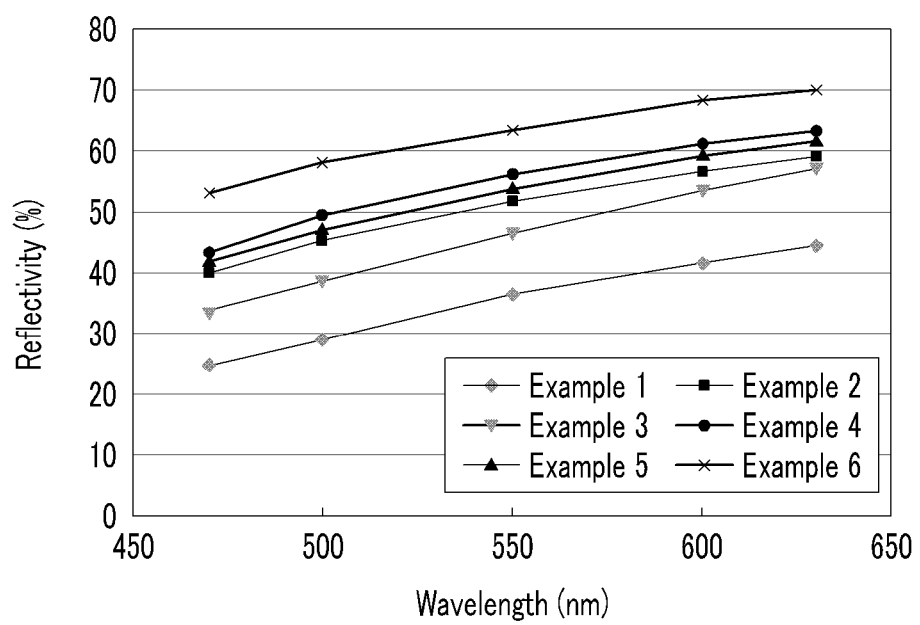
FIG. 3 is a graph showing reflectance of the organic light emitting diode devices according to Examples 1 to 6.

The result is explained referring to Table 1 and FIGS. 2 and 3. FIG. 2 provides a graph showing the transmittance of the organic light emitting diode devices according to Examples 1 to 6, and FIG. 3 provides the reflectance of the organic light emitting diode devices according to Examples 1 to 6.

TABLE 1

| | Yb thickness (Å) | Ag thickness (Å) | Surface resistance (Ω/cm²) | Transmittance (%, 550 nm) | Reflectance (%, 550 nm) |
|---|---|---|---|---|---|
| Example 1 | 80 | 180 | 4.9 | 38 | 36 |
| Example 2 | 80 | 220 | 2 | 24 | 51 |
| Example 3 | 60 | 200 | 4.8 | 28 | 46 |
| Example 4 | 60 | 220 | 2.3 | 25 | 56 |
| Example 5 | 40 | 180 | 2.5 | 36 | 53 |
| Example 6 | 40 | 220 | 1.8 | 23 | 62 |
| Example 7 | 120 | 100 | 10 | 47 | 28 |
| Example 8 | 120 | 150 | 9.1 | 41 | 25 |
| Example 9 | 180 | 140 | 9.2 | 40 | 35 |
| Example 10 | 200 | 120 | 10 | 46 | 40 |
| Comparative Example 1 | 35 | 250 | 1.2 | 18 | 65 |
| Comparative Example 2 | 30 | 260 | 1.1 | 15 | 67 |
| Comparative Example 3 | 180 | 80 | 37 | 49 | 26 |
| Comparative Example 4 | 220 | 120 | 23 | 45 | 41 |
| Comparative Example 5 | 300 (MgAg single layer) | | 18 | 16 | 59 |

Referring to Table 1, when ytterbium (Yb)/silver (Ag) are deposited to have the aforementioned thicknesses according to Examples 1 to 10, the organic light emitting diode devices had a sheet resistance of about 10 Ω/cm² or lower, but maintained transmittance ranging from about 20 to 50% in a wavelength of about 550 nm. As indicated above, these parameters are maintained where a thickness of the first layer 270*a* is at or between 15% and 62% of a total thickness of the combined first and second layers 270*a*, 270*b*.

In contrast, the organic light emitting diode devices of Comparative Examples 1 and 2 had low resistance, but also very low transmittance. Thus Comparative Examples 1 and 2 may not be usable as a transparent electrode. The devices of Comparative Examples 3 and 4 had higher resistance, and also may not be usable as an electrode in the OLED drives. The device of Comparative Example 5 had the high resistance (i.e., greater than 10 Ω/cm²), but had the low transmittance when it had a similar thickness to the devices of Examples 1 to 10.

In this way, the organic light emitting diode devices according to Examples 1 to 10 had low resistance of about 10 Ω/cm² or lower and transmittance ranging from about 10 to 50% in a wavelength of about 550 nm, and thus may be used as an electrode with low resistance and transmittance. Accordingly, aspects of the present invention provide an organic light emitting diode device including an electrode having improved conductivity and excellent photo-efficiency. Referring to FIGS. 2 and 3, since the organic light emitting diode devices according to Examples 1 to 6 had no large transmittance and reflectance changes in a visible ray region covering from short to long wavelengths, there is no requirement for a color correction of a particular color such as red.

While described in terms of organic light emitting diode devices, it is understood aspects of the invention can be utilized in other displays, including those not utilizing an organic light emitting layer, and the first and second layers can be reversed in the electrode.

Although a few embodiments of the present invention have been shown and described, it would be appreciated by those skilled in the art that changes may be made in this embodi-

What is claimed is:

1. An organic light emitting diode device comprising;
a first electrode;
a second electrode facing the first electrode; and
an emission layer disposed between the first and second electrodes,
wherein the first electrode comprises:
   a first layer having a thickness ranging from about 40 Å to 200 Å and comprising ytterbium (Yb), samarium (Sm), lanthanum (La), yttrium (Y), strontium (Sr), cesium (Cs), ruthenium (Ru), barium (Ba), or a combination thereof, and
   a second layer having a thickness ranging from about 180 Å to 250 Å and comprising silver (Ag), aluminum (Al), copper (Cu), chromium (Cr), or a combination thereof,
with the first electrode having a sheet resistance of about 5 $\Omega/cm^2$ or lower.

2. The organic light emitting diode device of claim 1, wherein the first electrode has a transmittance ranging from about 20 to 50% in a wavelength of 550 nm.

3. The organic light emitting diode device of claim 2, wherein the first layer comprises ytterbium (Yb) and the second layer comprises silver (Ag).

4. The organic light emitting diode device of claim 1, wherein the first electrode further comprises a third layer comprising an oxide, a nitride, or a nitrogen oxide.

5. The organic light emitting diode device of claim 4, wherein the third layer has a refractive index of about 1.5 or higher.

6. The organic light emitting diode device of claim 1, wherein the first electrode is a cathode and the second electrode is an anode.

* * * * *